United States Patent [19]

Nathans et al.

[11] Patent Number: 4,742,458

[45] Date of Patent: May 3, 1988

[54] METHOD AND APPARATUS FOR PERFORMING PATTERN RECOGNITION ANALYSIS

[75] Inventors: Robert Nathans, Bellport; Salvador R. Bozzo; Evan W. Rosen, both of East Setauket, all of N.Y.

[73] Assignee: Software Plus, Inc., Setauket, N.Y.

[21] Appl. No.: 792,648

[22] Filed: Oct. 29, 1985

[51] Int. Cl.$^4$ ............................................. G01R 23/16
[52] U.S. Cl. ..................................... 364/417; 128/702; 128/703
[58] Field of Search ................ 364/417; 128/702, 703, 128/704

[56] References Cited

U.S. PATENT DOCUMENTS

| | | | |
|---|---|---|---|
| 3,940,692 | 2/1976 | Neilson | 128/702 |
| 4,170,992 | 10/1979 | Dillman | 128/702 |
| 4,336,810 | 6/1982 | Anderson et al. | 128/702 |
| 4,603,703 | 8/1986 | McGill et al. | 364/417 |
| 4,616,333 | 10/1986 | Shimono | 364/417 |

OTHER PUBLICATIONS

R. Vincent, "A Flexible Signal-Averaging System for Cardiac Waveforms"; Jan. 1980.
Raymond E. Bonner, "Computer Diagnosis of Electrocardiograms.", 1968.

Primary Examiner—Jerry Smith
Assistant Examiner—Kimthanh Tui
Attorney, Agent, or Firm—Burgess, Ryan and Wayne

[57] ABSTRACT

A method and apparatus for performing pattern analysis of a digital signal containing at least one waveform, detects a fiducial point of each waveform of the digital signal; captures slope transition features separated by interval features of each of the waveforms of the digital signal; creates a signature for each waveform based on the captured slope transition and interval features of each of said waveforms; determines the closest proximity of the signature to one of a plurality of previously determined classifications of signatures; creates a new classification with the signature if the closest proximity has a value less than a predetermined threshold value; and adds the signature to the closest classification if the closest proximity has a value at least equal to the predetermined threshold value.

24 Claims, 4 Drawing Sheets

FIG. 4

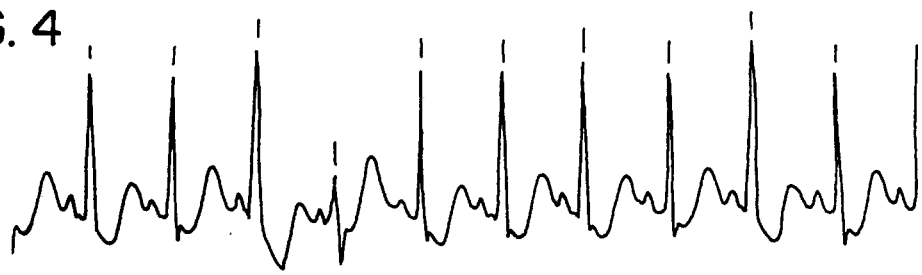

| 1 | 2 | 4 | 8n | 0 | 2 | 1 | 1 | 4 | 0 |
|---|---|---|---|---|---|---|---|---|---|
| 148 | 89 | 29 | 1 | 133 | 89 | 148 | 148 | 29 | 133 |
| 1 | 2 | 3 | 4 | 5 | 6 | 7 | 8 | 9 | 18 |

FIG. 5

```
SIGNATURES
       FEATURES   PROX   BIN   SIGNATURE
   1      7       216     1    CD░░ MNJJ  ]^JJ ef
   2      7       255     2    BC░░ MNJJ  ]^JJ gh
   3      7       236     4    BC░░ MNJJ  \]J  fg
   4     11       174 new 8    BC░░ LMJJ  [\JJ ef  T⊢jk ⊥ tu
   5      7       216     0    CD░░ LMJJ  \]J  fg
   6      7       219     2    BC░░ MNJJ  ]^JJ ef
   7      7       216     1    BC░░ NOJJ  \]JJ fg
   8      7       255     1    CD░░ NOJJ  \]JJ ef
   9      7       180     4    BC░░ NOJJ  ]^J⌐ ef
  10      7       216     0    BC░░ MNJJ  [\JJ gh
```

FIG. 6

FIG. 7

```
BINS
BIN  COUNT  SIGNATURE
  0   133   BC░░ LMJJ [\JJfg
  1   148   CD░░ NOJJ \]JJef
  2    89   BC░░ MNJJ ]^JJgh
  3     1   BC░░ NOJJ [\JJgh T⊢jk ⊥ tu
  4    29   BC░  LMJJ \]J⌐fg
  5     6   BC░  MNJJ [\J⌐ef
  6    10   CD░  LMJJ [\J⌐gh
  7     4   CD░  LMJJ [\⌐Lef
  8     1   BC░░ LMJJ [\JJef T⊢jk ⊥ tu
```

METHOD AND APPARATUS FOR PERFORMING PATTERN RECOGNITION ANALYSIS

BACKGROUND OF THE INVENTION

This invention relates generally to a method and apparatus for performing pattern recognition analysis and, more particularly, is directed to a method and apparatus for performing pattern recognition analysis on substantially periodic and/or recurring signals.

In various technologies, it is necessary and desirable to monitor and detect abnormalities in periodic and/or recurring signals. For example, in cardiology, a Holter type tape recording device has been used to record electrocardiographic (EKG) data over a 24 hour time span. During this time span, there may be 100,000 heartbeats. Since approximately 98% of all heartbeats are normal, diagnosis is often based on the existence of only one or two abnormal beat types, occurring perhaps only a total of a half-dozen times on the tape.

Conventionally, recognition of a periodic waveform, such as an EKG waveform, has been performed by comparing the EKG waveform to a fixed or standard waveform, for example, as disclosed in U.S. Pat. No. 4,023,276. In order to determine the fixed waveform, U.S. Pat. No. 4,124,894 teaches the detection of EKG signals from a patient to generate a model waveform for that patient which is resolved into contour intervals, for example, PR, QR, ST and T intervals, to establish a set of interval limits for each patient to which samples of subsequently monitored waveforms are compared. The waveforms may be aligned with their fiducial or starting points located at the centrodes of the EKG waveform, for example, as described in U.S. Pat. No. 4,170,992. U.S. Pat. No. 3,874,370 discloses the continuous recirculation of existing EKG waveforms to update the reference waveform.

After the reference or standard waveform is fixed, known devices utilize complex mathematical analysis in comparing subsequent EKG waveforms to the standard waveform. This includes, for example, an amplitude analysis whereby correlation is performed by determining the normalized area of non-overlap, as disclosed in U.S. Pat. No. 4,170,992. See also U.S. Pat. Nos. 4,211,237 and 4,456,959.

Such complex mathematical analysis may require the use of a main frame or mini-computer, as disclosed in U.S. Pat. No. 3,504,164, and has typically been prohibitively expensive in terms of execution time and hardware costs, generally using a large amount of memory. A further deficiency with such mathematical analysis is that the computations are generally not performed in a real time mode. In other words, the computations occur at a time much later than the occurrence of the event, that is, after the EKG waveform has occurred. When dealing with periodic signals, such as EKG waveforms, where it is imperative to have up-to-date data, such mathematical analysis may not be satisfactory. For example, in a critical care situation involving a patient continuously connected to an EKG machine, certain types of abnormal EKG waveforms may immediately precede massive heart damage or death. Quick recognition of such waveforms, embedded among long sequences of normal or non-threatening waveforms, is therefore desirable.

In addition, and related to the problem of real time analysis, it would also be desirable to characterize the different waveforms, so that easy and ready recognition thereof can be achieved. For example, if one deviated EKG waveform is generated more often than it should, this could be an indication of a heart problem. With such complex mathematical analysis, this becomes practically impossible.

Other applications in the EKG and other pattern recognition fields are disclosed in U.S. Pat. Nos. 2,648,822; 3,616,791; 3,654,916; 3,755,783; 3,779,237; 3,821,948; 3,878,832; 3,903,874; 3,940,692; 4,211,238; 4,417,306; 4,446,872; 4,453,551; and 4,466,440.

Another field where it is desirable to monitor periodic waveforms is with rotating machinery, such as gas turbines and high speed motors, where catastrophic component failure is typically preceded for a short time by slight changes in the shape of the characteristic acoustical waveform of the machine. In such case, the detection of failure-indicative acoustical patterns could be used to shut down the affected machine in an orderly manner while the failure was minor or limited.

Still another field where it is desirable to monitor periodic waveforms is with oil well dipmeter logs, where it is necessary to interpret readings of physical properties of the ground surrounding a bore hole as a function of distance down the bore hole, to detect whether hydrocarbons are present, whether there is a change in tilt of underground formations, and the like. In some cases, miles of readings may be taken from several sensors at once at intervals of an inch or less. Such logs must then be analyzed.

The same problems of monitoring and detection discussed above with respect to EKG waveforms apply with equal force to rotating machinery, oil well dipmeter logs and the like. Thus, in each field, it is necessary to recognize problems from raw data which contains relatively small but significant amounts of diagnostic or predictive information of interest.

The use of pattern recognition techniques to detect similar waveforms is also known. Generally, with pattern recognition techniques, the first step is to detect and establish the patterns and pattern boundaries (and possibly the fiducial or starting points). As a common alternative, Fourier transform snapshots are periodically derived from the input signal, which implicitly provide pattern boundaries consisting of frequency limits and a fiducial point consisting of the zero or center frequency. Such location of pattern boundaries may be performed interactively and iteratively with known pattern recognition algorithms.

However, use of a comparison operation in the first step is typically prohibitively expensive in terms of the execution time and hardware cost. Thus, continuous, simultaneous cross-correlation between an incoming signal and many possible matching patterns, for example, using a least squares difference operation, is computationally straightforward, but also involves a great deal of computational expense. Furthermore, cross-correlation does not necessarily yield useful comparison indices between patterns. This is true, for example, when patterns are shifted with respect to each other by a large amount without altering the general shape of the pattern. In such case, prior to detecting the pattern features, it is necessary to first detect such shifting of the pattern. Because of these difficulties, pattern boundary detection is most often performed by some type of simple threshold-crossing detection, rather than by pattern matching. As a result, such detection is effected by random noise and the like.

The second step in pattern recognition involves the derivation of sets of indicative parameters or features of the isolated pattern to be detected, generally by computational and comparative hardware and software. A feature of a pattern can be considered as a connected subset of the pattern, for example, the T wave in an EKG pattern, or a notch in a turbine's acoustical signal. The features or parameters of a pattern combine to form a "signature" of the pattern. Generally, however, the types of signatures that can be created have been constrained by the comparison methods available or specially designed for the third step.

The third step in conventional pattern recognition techniques, is the step of generating an index of similarity between the isolated pattern to be detected and previously defined patterns. However, conventional techniques are still relatively primitive. Generally, a specially developed cross-correlation, comparison algorithm must be developed for the particular application. This has been detrimental due to the difficulty in developing such algorithms and dissatisfaction with the end performance of the pattern matching system.

Although generalized comparison algorithms have been generated for the third step, known as "rule-based" algorithms, such algorithms employ too may voting ("if" statements) and branching schemes to detect whether the parameter or features derived in the second step are defined by certain limits. Specifically, this type of comparison algorithm examines target patterns according to certain predefined operations to match up the new pattern, that is, casts ballots for appropriate patterns, or program branches must be followed before continuing evaluation. In sum, "rule-based" pattern matching systems are notoriously difficult to create, maintain and modify, and are non-generic by definition, such that rules from one application cannot be carried over to another application.

An overall shortcoming of all pattern recognition systems is the absence of a coherent method of representing continuous features when detecting discrete features, and vice versa, in such a way as to allow construction of a fast and simple way of comparing patterns represented as groups of such features. When discussed herein, a discrete feature indicates the existence or absence of a parameter in a pattern, such as the T wave in an EKG pattern. A continuous feature, on the other hand, is a quantifiable aspect of the pattern, for example, the width of the T wave in an EKG pattern.

As an example, in pattern recognition applied to EKG waveforms, it may be desirable to represent the presence or absence of specific discrete features, such as the Q wave. However, discrete information of this type is not preserved by continuous pattern comparison algorithms, such as those that use cross-correlation. In like manner, for example, for "rule-based" algorithms used to detect discrete features, it may be desirable to detect certain continuous features, such as the duration of the discrete feature or the like. However, continuous information of this type is not easily handled by "rule-based" algorithms. Because of such considerations, there has generally been employed awkward and hard to manage marriages of "rule-based" algorithms and analytical algorithms. Such systems, however, are easily fooled by new pattern variations, artifacts or noise.

OBJECTS AND SUMMARY OF THE INVENTION

Accordingly, it is an object of the present invention to provide a method and apparatus for performing pattern recognition analysis in real time or from recorded data.

It is another object of the present invention to provide a method and apparatus for performing pattern recognition analysis which recognizes both discrete and continuous features of a pattern.

It is still another object of the present invention to provide a method and apparatus for performing pattern recognition analysis by transforming the raw data into strings of characters representing features of the pattern, and comparing the strings of characters.

It is yet another object of the present invention to provide a method and apparatus for performing pattern recognition analysis which translates the pattern into a string of characters, thereby reducing the affects of random noise in the pattern during pattern recognition analysis.

It is a further object of the present invention to provide a method and apparatus for performing pattern recognition analysis that classifies incoming patterns and logs the same with respect to sequence and timing of classified patterns.

It is still a further object of the present invention to provide a method and apparatus for performing pattern recognition analysis that provides a system of approximate reconstruction of raw data from logs of stored patterns.

In accordance with an aspect of the present invention, a method of performing pattern analysis of a digital signal containing at least one waveform, comprises the steps of detecting a fiducial point of each waveform of the digital signal; capturing at least two characteristic features of each of the waveforms of the digital signal; creating a signature for each waveform based on the captured at least two characteristic features of each of the waveforms; determining the closest proximity of the signature to one of at least one previously determined classification of signatures; creating a new classification with the signature if the closest proximity has a value less than a predetermined threshold value; and adding the signature to the one classification if the closest proximity has a value at least equal to the predetermined threshold value.

In accordance with another aspect of the present invention, apparatus for performing pattern analysis of a digital signal containing at least one waveform, comprises means for detecting a fiducial point of each waveform of the digital signal, for capturing at least two characteristic features of each of the waveforms of the digital signal, and for creating a signature for each waveform based on the captured at least two characteristic features of each of the waveforms; means for determining the closest proximity of the signature to one of at least one previously determined classification of signatures; and means for storing the signature as a new classification if the closest proximity has a value less than a predetermined threshold value, and for storing the signature as part of an existing classification if the closest proximity has a value at least equal to the predetermined threshold value.

The above, and other, objects, features and advantages of the present invention will become readily apparent from the following detailed description which is

BRIEF DESCRIPTION OF THE DRAWINGS

FIG. 4 is a waveform diagram of raw EKG data, with superimposed markers and pattern related data thereon;

FIG. 5 is a table of signatures generated for the waveform patterns of FIG. 4;

FIG. 6 is a waveform diagram of recognized waveforms that have been classified in different bins; and FIG. 7 is a table of signatures generated for the waveform patterns of FIG. 6.

DETAILED DESCRIPTION OF A PREFERRED EMBODIMENT

Figure 1:
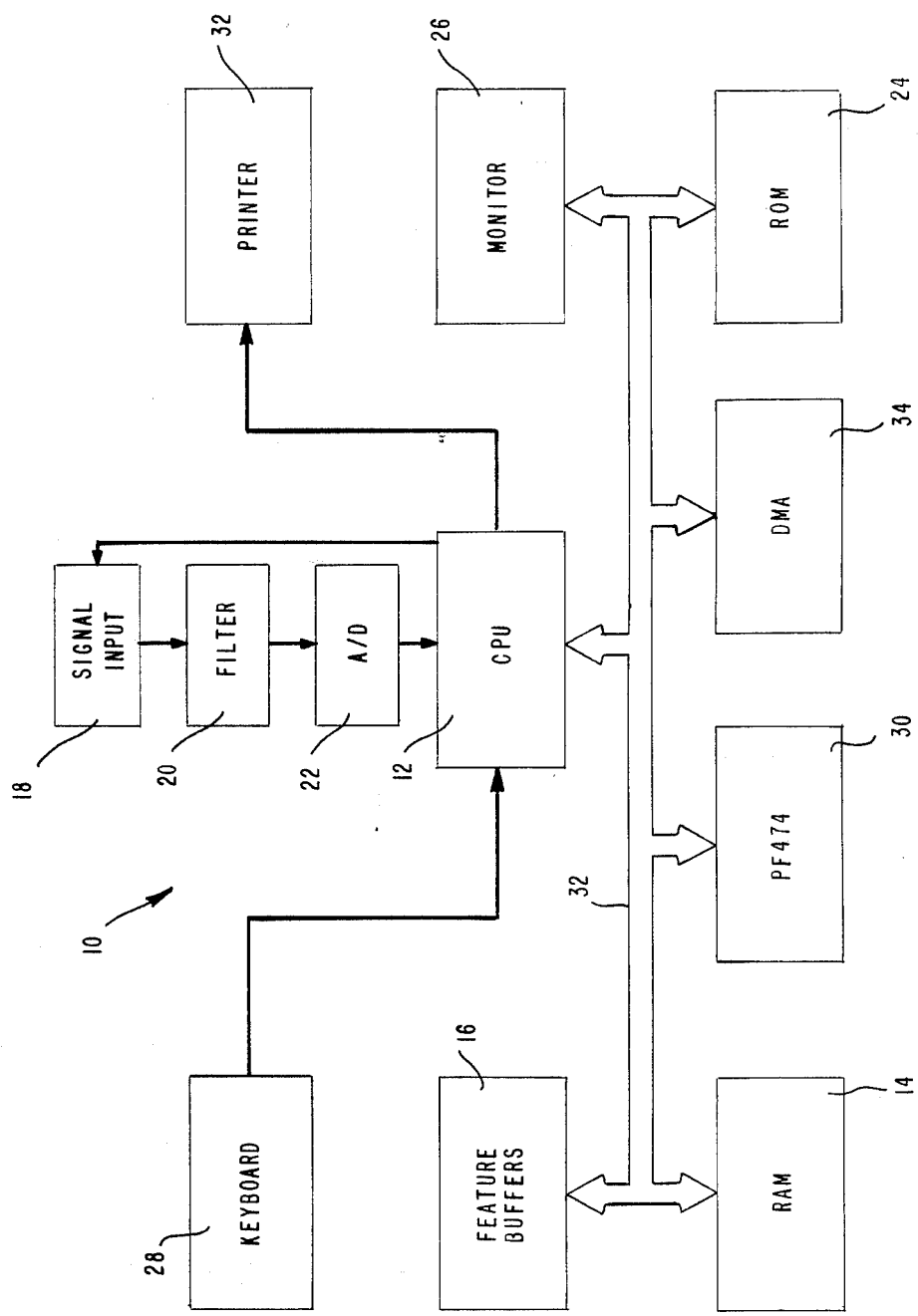
FIG. 1 is a block diagram of pattern recognition apparatus according to one embodiment of the present invention.

Referring to the drawings in detail, and initially to FIG. 1 thereof, pattern detection apparatus 10 according to one embodiment of the present invention includes a central processing unit (CPU) 12 which can, for example, be part of an IBM-PC Personal Computer, having between 240K and 640K of a random access memory (RAM) 14 and having a plurality of buffers or registers 16, although buffers 16 may be incorporated as part of RAM 14. CPU 12 is supplied with an input signal from a signal input 18, after the input signal passes through a filter 20 for eliminating spurious noise and an analog-to-digital (A/D) converter 22 which digitizes the input signal. Filter 20 can be a band pass filter which attenuates signals below approximately 0.3 Hz and above approximately 40 Hz, such frequency components generally not containing any relevant information for later analysis. Digitization by A/D converter 22 preferably is at the rate of 128 samples per second, and can be performed by a Data Translation DT2801-A data acquisition and control unit, which is compatible with an IBM-PC Personal Computer.

Signal input 18 can be a Holter monitor with electrodes attached to a patient and which supplies an EKG signal in real time to CPU 12, or a tape playback unit which contains previously recorded EKG signals. In the case of a tape playback unit, CPU 12 can control the speed of replay of the data to keep it slightly ahead of the pattern recognition process so that CPU 12 does not remain idle and, in this regard, there is a signal line from CPU 12 back to signal input 18. With a tape playback unit, the operation can be performed at approximately 20–40 times real time. Instructions for operating CPU 12 can be contained in a read only memory (ROM) 24 or be supplied to CPU 12 from software input into the system in a conventional manner. In addition, a video monitor 26 is connected with CPU 12 for displaying desired waveforms and results, as requested through a keyboard 28, also connected to CPU 12.

In accordance with the present invention, a pattern recognition chip 30 is also connected to CPU 12. Pattern recognition chip 30 is preferably a PF 474 chip sold by Proximity Technology Inc. of Ft. Lauderdale, Fla. and described in detail in U.S. Pat. No. 4,490,811, the entire disclosure of which is incorporated herein by reference. This chip is also discussed in an article by Steve Rosenthal, "The PF 474" by Byte magazine, November, 1984, pages 247–253 and an article by one of the inventors of the chip, Peter N. Yianilos, "A Dedicated Comparator Matches Symbol Strings Fast and Intelligently" in Electronics magazine, Dec. 1, 1983. PF 474 pattern recognition chip 30 is presently sold as part of a PF-PC board which plugs into an IBM-PC Personal Computer, and which contains support circuitry, mostly composed of a direct memory access (DMA) (not shown) on the PF-PC board.

In addition, a printer 32 may be connected to CPU 12 for producing a hard copy of certain data. CPU 12, RAM 14, buffers 16, ROM 24, monitor 26 and pattern recognition chip 30 are interconnected through a bus line 32. In addition, although the PF-PC board associated with PF 474 pattern recognition chip 30 contains an internal DMA for increasing the speed of data transfer, an external DMA 34 can also be connected to bus line 32. Thus, after the signal is digitized, it is routed through DMA 34 into a circular buffer in RAM 14, which buffer may be set to 64K. For example, if each sample includes two bytes of information, the buffer is capable of containing in excess of one minute of real time data for each 16K of RAM 14.

Figure 2:
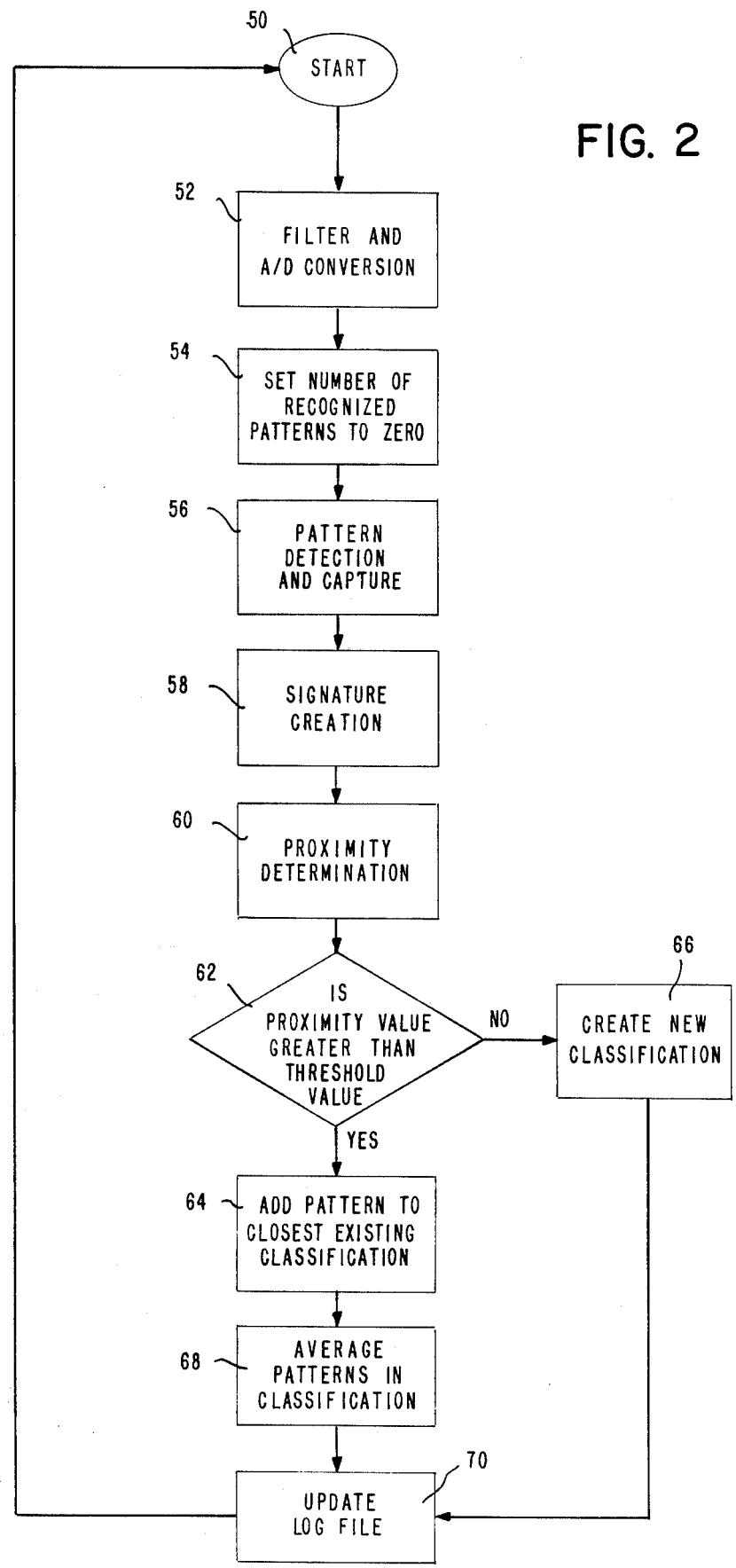
FIG. 2 is a flow chart used for illustrating the general operation of the apparatus of FIG. 1.

Referring now to FIG. 2, a generalized flow chart showing operation of the apparatus 10 of FIG. 1 will now be described, and will be done so with respect to EKG waveforms for ease of description. After the operation is started in step 50, the first step 52 in the process is to filter and digitize the EKG signal through filter 20 and A/D converter 22, the EKG signal either being supplied as real time data, for example, from a Holter monitor, or as data which has previously been recorded on a tape by a tape playback unit. It will be noted that filter 20 may be omitted, with filtering being performed on the digital information by CPU 12. For example, by using a 4-delta table, as will be explained in greater detail hereinafter, to produce a signature for each EKG waveform, a low pass filtering operation occurs which approximates the band pass filtering operation of filter 20, in a satisfactory manner. Thus, the 4-delta table functions to pass only those signals with frequencies less than approximately 30–40 Hz. This eliminates the high frequency chatter noise commonly found in such signals. As to low frequency drift which occurs with taped signals, although the 4-delta table does not compensate for such drift, high quality tape recorders generally have circuitry which will compensate such drift.

Next, the number of recognized patterns is set to zero in step 54, in order to avoid later errors from data contained in memory.

The next step 56 is to detect and capture the pattern, for use in the pattern recognition operation that follows. This includes the first step of distinguishing between an artifact and the presence of an EKG waveform, using techniques conventional in the art of EKG waveform analysis. Basically, this is performed in CPU 12 by detecting the onset of the QRS part of the EKG waveform. It is to be noted that the QRS part of the EKG waveform also functions as the fiducial or starting point of the waveform for further analysis. Then, various features of the waveform, both discrete and continuous, are translated into a string of characters which make up the signature.

Basically, there are only two types of features that are used, namely, slope transitions and intervals between such slope transitions. With respect to slope transitions, if the absolute difference between two successive points in the signal is below a threshold value, then the segment is termed "flat". Otherwise, the segment is classified as one of three "upslopes" (positive slope) or three "downslopes" (negative slope), in accordance with the magnitude and sign of the difference between the two successive points. Thus, a slope transition is between an upslope and a flat, a flat and an upslope, a downslope and a flat, a flat and a downslope, an upslope and a downslope or a downslope and an upslope. For an EKG pattern, all feature sequences start with a representation of an upslope or downslope transition, followed by an interval representation, and so on in alternating order, and ending with a slope representation.

Figure 3:
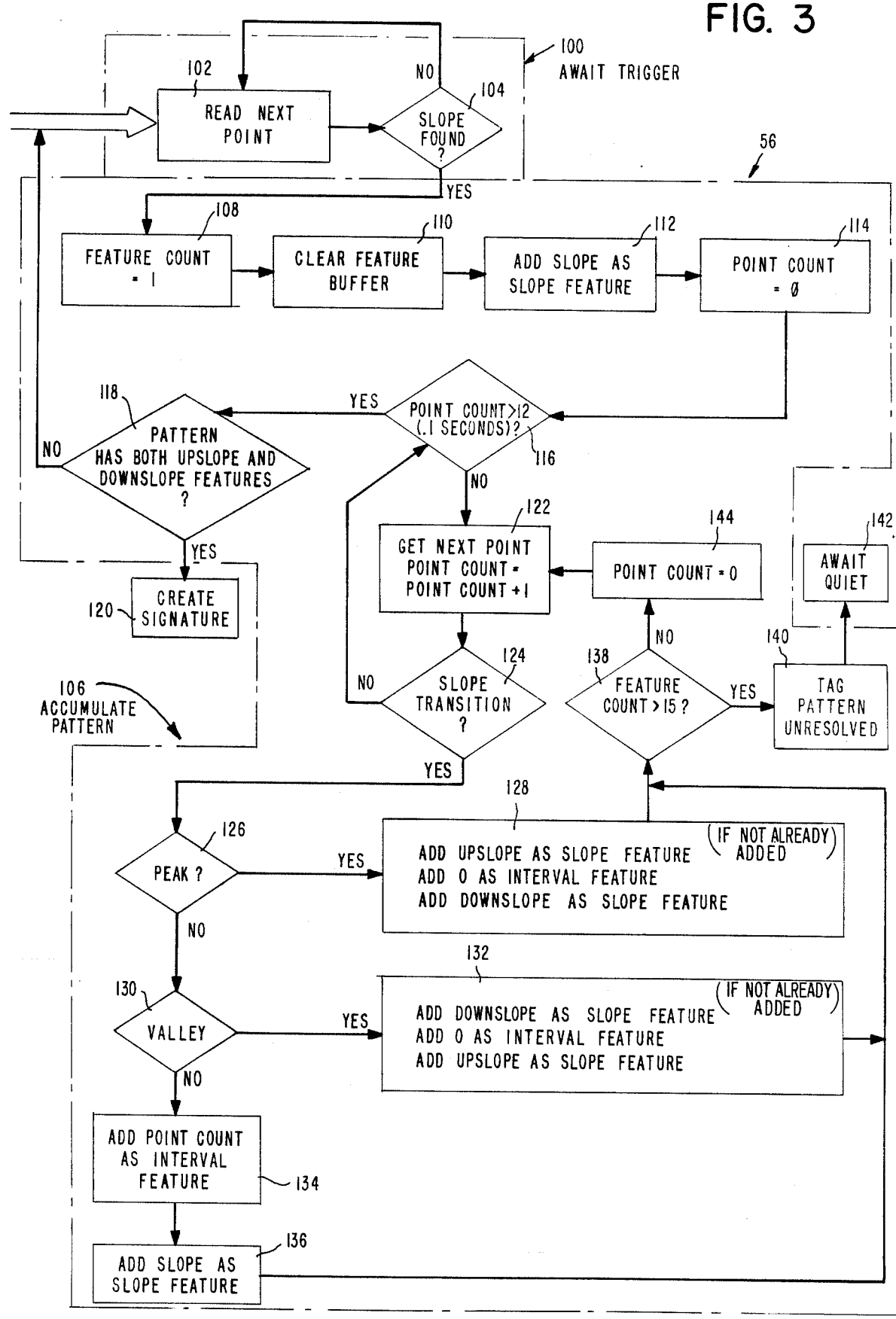
FIG. 3 is a flow chart used for illustrating the pattern detection and capture step of FIG. 2.

Referring now to FIG. 3, a detailed flow chart of the operation for detecting and capturing the pattern will now be described. First, the waveform must be detected. This is performed in an AWAIT TRIGGER operation 100. Generally, the filtered, digitized signal is supplied to a circular buffer in RAM 14 and is read point by point in step 102 and scanned in step 104 until a non-flat segment is found, that is, until an upslope or downslope is found. If no slope transition is found in step 104, the next point is read in step 102, and so on, until a slope transition is detected, which functions as a TRIGGER, whereby the process continues to an ACCUMULATE PATTERN operation 106.

In the ACCUMULATE PATTERN operation 106, the number of features, that is, the number of slope transition features and interval features, that are detected, is set to 1 in a feature count step 108. Next, a feature buffer, as part of RAM 14 or a register 16 associated with CPU 12, which is used to accumulate the features of the pattern, is cleared in step 110. Next, in step 112, the slope transition which triggered the branch to the ACCUMULATE PATTERN operation 106, is stored in the feature buffer. The steps which follow are used to record the sequence of slope transitions and intervals which characterize the possible pattern. This accumulation proceeds until the pattern is resolved and the signature is then generated, or the pattern is deemed unresolved.

It is therefore next determined whether a valid pattern has been found. Thus, in step 114, a sampling point count buffer of RAM 14, which is used to mark the end of the first detected transition, is set to zero. It is next detected, in step 116, whether the following interval has a time period greater than a predetermined time period. This can be performed by counting clock or sampling point pulses. Thus, for example, if 120 clock pulses correspond to one second, it can be detected whether the point or clock pulse count is greater than 12 (0.1 second). If the point count is greater than 12, indicating that there may be an invalid or unresolved pattern or that the pattern is complete, in step 118, it is next determined whether the pattern has both unslope and downslope features. If not, indicating an invalid or unresolved pattern, the operation returns back to step 102 of the AWAIT TRIGGER operation 100 for detection of a TRIGGER signal. If yes, this is an indication that a valid pattern exists, and the signature is created in step 120.

Of course, in the first pass through step 116, the point count is less than 12 since it had been set to zero in the previous step 114, and therefore the operation does not pass to step 118. The indication of an unresolved pattern in step 118 comes at a later time. Steps 116 and 118 are included basically for the situation where the feature count is less than fifteen in step 138, to be discussed later, whereby the pattern may be deemed resolved, when in fact, it is not a true or complete pattern. Thus, in the case where there are less than fifteen features, and the point count is greater than 12 (signaling the end of the pattern), a feature test is applied in step 118 to determine if both upslope and downslope transitions are present in the features of the possible pattern. This helps to eliminate artifacts such as level shifts or unusually strong T waves, which have erroneously triggered the ACCUMULATE PATTERN operation 106. Such false triggers will almost always give rise to patterns which have transitions either only to upslopes or only to downslopes. Thus, if the features of the possible pattern do not contain slope transitions to both upslopes and downslopes, then the possible pattern is discarded and the process returns to the AWAIT TRIGGER operation 100. If there are both upslopes and downslopes, the possible pattern is deemed an actual pattern, and its signature is generated in step 120.

If the point count in step 116 is less than 12, the operation continues to step 122 to determine the signature. As discussed above, in the first pass through step 116, the answer will be in the negative, since the point count was set to zero in the previous step, whereupon the operation continues to the next step 122.

In step 122, the next point is sampled and the sampling point count is increased by one. In step 124, it is determined whether there is a slope transition between the present sampling point and the sampling point of the last slope transition. If not, it is questioned in step 116 whether the point count between these two sampling points is greater than 12 and, if yes, the operation continues to step 118, as described above. If not, the operation continues back cyclically between steps 116, 122 and 124 until a slope transition is detected. As discussed above, if the first slope transition feature that triggered the operation is an upslope, the next slope transition to be detected is either a flat or a downslope.

It is next determined whether there is a peak or a valley, which represents a special situation where the slope transition is between an upslope and a downslope, or between a downslope and an upslope, respectively. It will be appreciated that the typical occurrence is between an upslope and a flat, or vice versa, or between a downslope and a flat, or vice versa. Thus, in step 126, it is detected whether there is a peak, and if so, an upslope is added as the slope transition feature (if not added already), followed by a zero interval feature and followed by a downslope feature, in step 128. If no peak is detected in step 126, it is next detected in step 130 whether a valley exists, and if so, a downslope is added as the slope feature (if not added already), followed by a zero interval feature and followed by an upslope feature, in step 132. If no peak or valley is detected, the operation continues to step 134, where the point count is added as an interval feature. If step 134 is reached, indicating that there is no peak or valley, the next slope transition is necessarily a flat, and there is a non-zero interval feature between slope transition features. Thus, the point count between slope transitions is detected and this is added as the interval feature, in step 134, and the slope transition feature, that is, the flat, is added in step 136. It will be appreciated from the above that each slope transition feature must be followed by an interval feature (except for the last slope transition feature), in the example using EKG patterns.

After either of steps 128, 132 or 136, depending on which branch is followed, the operation continues to step 138 to determine whether the feature count is greater than fifteen. Generally, for an EKG pattern, if more than fifteen slope transition features and interval features have been recorded, this is an indication that the possible pattern may have been contaminated with noise or is otherwise unresolvable. Thus, if the feature count is greater than fifteen, the pattern is tagged as unresolved, as noted in step 140. Then, the ACCUMULATE PATTERN operation 106 has been completed, whereby the process continues with an AWAIT QUIET operation 142. In the AWAIT QUIET operation 142, data is read until the QUIET CRITERION, which is discussed in greater detail hereinafter, is met, indicating the end of the pattern. At this time, the region of the unresolved pattern, from the TRIGGER point to the beginning of the quiet area, determined by the QUIET CRITERION, is written to an unresolved file, and a code representing the unresolved pattern is written to a log file, which will be discussed later. Thereafter, the process returns to the AWAIT TRIGGER operation 100.

If the feature count is detected as being less than fifteen in step 138, the operation continues to step 144, where the point count is again set to zero, and then to step 122, as discussed above, whereby the above steps are repeated, in order to detect and capture the entire pattern. Finally, when there are no more slope transitions, and the point count is greater than 12 (QUIET CRITERION), indicating the end of the pattern in step 116, the operation continues through steps 118 and 120, where the signature is created.

To generate a signature of a pattern from the record of slope transitions and intervals defining the pattern, the following rules are used. Each transition and each interval in the feature record of the pattern is represented by two bytes in the pattern signature. The signature is built sequentially with the zeroth slope transition in the feature record corresponding to the first two bytes of the signature, followed by the zeroth interval in the feature record corresponding to the next two bytes of the signature, and so on. The sets of bytes from which each successive pair of bytes in the signature are drawn are all disjoint. Thus, no byte in a signature is ever the same as any other byte.

It will be noted that the above steps in FIG. 3 are of a general nature, and in order to better understand the operation thereof, a specific example as applied to an EKG signal will now be given. Assuming the aforementioned clock rate of 120 clock pulses per second, which is used as the sampling rate, for a sampling time period of three-quarter ($\frac{3}{4}$) second, the following raw digital data comprised of 90 sampling points, corresponding to approximately one EKG waveform, was obtained:

TABLE I

| | | | | RAW DATA | | | | | |
|---|---|---|---|---|---|---|---|---|---|
| | (0) | (1) | (2) | (3) | (4) | (5) | (6) | (7) | (8) | (9) |
| (0) | 117 | 117 | 117 | 117 | 116 | 114 | 113 | 112 | 110 | 108 |
| (10) | 108 | 108 | 107 | 108 | 109 | 112 | 112 | 114 | 115 | 113 |
| (20) | 109 | 106 | 106 | 108 | 108 | 109 | 112 | 115 | 121 | 128 |
| (30) | 131 | 130 | 117 | 100 | 087 | 088 | 096 | 101 | 103 | 104 |
| (40) | 104 | 103 | 104 | 105 | 106 | 106 | 107 | 109 | 111 | 112 |
| (50) | 115 | 119 | 122 | 125 | 128 | 131 | 134 | 135 | 137 | 139 |
| (60) | 138 | 138 | 136 | 134 | 131 | 127 | 125 | 124 | 121 | 120 |
| (70) | 119 | 118 | 117 | 116 | 116 | 115 | 115 | 115 | 114 | 116 |
| (80) | 117 | 117 | 119 | 119 | 117 | 114 | 111 | 109 | 110 | 109 |

The next step is to determine a TRIGGER or threshold value used to detect the start of the pattern for pattern detection purposes. This is performed, for example, over a six second interval when the EKG waveforms are first produced. An example of raw EKG data occurring over a six second time interval is shown in FIG. 4, in which the vertical lines over the peaks mark the fiducial points of each heart beat. The first row under each heartbeak of FIG. 4 corresponds to the bin in which the pattern has been classified, the second row corresponds to the total number of heartbeats classified in this bin, and the third row corresponds to the pattern number in this particular frame or drawing. The raw data of Table I corresponds to the heartbeat of pattern number four (bin 8) of FIG. 4. The "n" following the "8" in the first row of FIG. 4 indicates that a new classification has been started.

The determination of the threshold value may be performed by any conventional means. For example, one method of determining the threshold value is to first determine the average of the seven (7) highest differences between consecutive values of sampling points during such six second interval, and then halve this average value.

In the present example, if the calculated value is between 6 and 25, inclusive, as is typical, then this value becomes the threshold value. If the calculated value is below 6, then the threshold value is set equal to 6, and if the calculated value if greater than 25, the threshold value is set equal to 25. For purposes of the example which follows, the threshold value has been determined to be 16. As will be made clear from the discussion which follows, for determining the signature, values of features of the signature are denoted in terms of multiples of the threshold value.

The next step is to prepare a 4-delta table by computing the difference between the data of each sampling point and the data which was sampled four sampling intervals ago. The four sampling interval period, corresponding to four sampling or clock pulses, is equivalent to a time period of 1/30 second. For example, the 4-delta value for sampling point 15 (having a sampled value of 112) is equal to 112−108 (from sampling point 11)=+4. The 4-delta table is thereby produced as follows:

TABLE II

| | | | | 4-DELTA | | | | | |
|---|---|---|---|---|---|---|---|---|---|
| | (0) | (1) | (2) | (3) | (4) | (5) | (6) | (7) | (8) | (9) |
| (0) | XXX | XXX | XXX | XXX | −1 | −3 | −4 | −5 | −6 | −6 |
| (10) | −5 | −4 | −3 | 0 | +1 | +4 | +6 | +6 | +6 | +1 |
| (20) | −4 | −8 | −9 | −5 | −1 | +3 | +6 | +7 | +13 | +19 |
| (30) | +19 | +15 | −4 | −28 | −44 | −42 | −21 | +1 | +16 | +16 |
| (40) | +8 | +2 | +1 | +1 | +2 | +3 | +3 | +4 | +5 | +6 |
| (50) | +8 | +10 | +11 | +13 | +13 | +12 | +12 | +10 | +9 | +8 |
| (60) | +4 | +3 | −1 | −5 | −7 | −11 | −11 | −10 | −10 | −7 |
| (70) | −6 | −6 | −4 | −4 | −3 | −3 | −2 | −1 | −2 | +1 |
| (80) | +2 | +2 | +5 | +3 | 0 | −3 | −8 | −10 | −7 | −5 |

As stated above, values of features of the signature are denoted in terms of multiples of the threshold value. In this regard, the 4-delta values are translated to 4-delta translation values in correspondence with multiples of the threshold value. The following 4-delta translation table for slope transitions is illustrative, and assumes a threshold value of 16:

TABLE III

4-DELTA TRANSLATION TABLE

| ABSOLUTE VALUE OF 4-DELTA VALUE | TRANSLATION VALUE |
|---|---|
| 0-15 | 1 |
| 16-31 | 2 |
| 32-47 | 3 |
| 48-63 | 4 |

Before proceeding further, it is to be remembered that the signature of a pattern is determined in accordance with the slope transitions, that is, an upslope, downslope or flat, and with intervals between the slope transitions. A specific example for determining and capturing the signature of the EKG waveform defined by the sampling data of Table I will now be given.

The signature of the EKG waveform of Table I is computed from the 4-delta values of Table II, as follows. The system begins in the AWAITING TRIGGER state, where it looks for the first 4-delta value (absolute value) which is equal to or greater than the threshold value of 16, at which time the ACCUMULATION PATTERN operation is entered. Referring back to Table II, the first occurrence of a 4-delta value equal to or greater than the threshold value of 16, occurs at sampling point 29, which has a 4-delta value equal to +19. The value +19 falls in the range of 16 to 31 of the aforementioned 4-delta translation table (Table III) and is therefore set equal to 1. This is the TRIGGER.

Generally, the zeroth, first, second and so on upslopes and downslopes are each assigned initial distinct values to which the 4-delta translation value is added. Thus, the zeroth slope feature contains values in the range of 65-69 if there is an upslope and 70-74 if there is a downslope, the first slope feature contains values in the range of 75-79 if there is an upslope, and so on, in accordance with the following table:

TABLE IV

SLOPE SIGNATURE BYTE SETS

| Slope Feature Number | Upslope Set | Downslope Set |
|---|---|---|
| 0 | 65-69 | 70-74 |
| 1 | 75-79 | 80-84 |
| 2 | 85-89 | 90-94 |
| 3 | 95-99 | 100-104 |
| 4 | 105-109 | 110-114 |
| 5 | 115-119 | 120-124 |
| 6 | 125-129 | 130-134 |
| 7 | 135-139 | 140-144 |

It will thus be understood that the minimum value for an upslope feature in the zeroth slope feature is 65. The sampling point 29 having a 4-delta value of +19 and a 4-delta translation value of 1 represents the zeroth upslope. Accordingly, if the zeroth upslope is initially assigned the minimum value 65, the 4-delta translation value of 1 is added to this minimum value to arrive at the first byte of the signature, that is, 66. The second byte of the signature is equal to the first byte, incremented by one. Thus, the first and second bytes of the signature, which represent the zeroth slope feature, is equal to 66 67. The reason that the second byte is always added is to provide a "blurring" effect so that minor deviations in patterns can be accounted for in order to improve the signature comparison operation, which will be described in greater detail hereinafter. This blurring applies to all features of the pattern, both slope transition features and interval features. For example, if interval features were represented by only one byte, a zero interval (peak or valley) might be represented by the single byte 128, while an interval which translated to a magnitude of one (between either an upslope or downslope and a flat) might be represented by a single byte 129, and there would be zero proximity contribution arising from comparison thereof since it introduces sharp discontinuities into what had been a continuous feature. By representing values by groups of ordered bytes, such as groups of two bytes, it is possible to "re-smooth" the discontinuities and restore the continuous nature of the feature.

It is next necessary to determine the zeroth interval feature, that is, the interval between sampling point 29 and the next sampling point at which a transitional event occurs. The next event or transition occurs at sampling point 31, having a 4-delta value of +15. Generally, any 4-delta value less than the threshold value of 16 is determined to be a flat. Thus, there is a transition from an upslope (sampling point 29 having a 4-delta value of +19) to a flat (sampling point 31 having a 4-delta value of +15). It is to be noted that, since sampling point 30 has a 4-delta value of +19, this would constitute an upslope, so that there would not be a transition. The interval between sampling point 31 and sampling point 29 is 31−29=2. As with Table III, an interval translation table, as follows, is used:

TABLE V

| NUMBER OF SAMPLING POINTS IN INTERVAL | TRANSLATION VALUE |
|---|---|
| 0 | 0 |
| 1 | 1 |
| 2 | 2 |
| 3-4 | 3 |
| 5-7 | 4 |
| 8-12 | 5 |

Thus, the interval translation value is equal to 2.

As with Table IV, there are certain byte sets assigned to the zeroth, first, second and so on interval features. Since the maximum number of intervals between transitions in a pattern is one less than the maximum number of transitions thereof, 42 different bytes are required for interval signature elements. These bytes may be made up of the 42 bytes immediately following those used for transition signature elements of Table IV, as follows:

TABLE VI

INTERVAL SIGNATURE BYTE SETS

| Interval Feature Number | Byte Set |
|---|---|
| 0 | 152-158 |
| 1 | 159-165 |
| 2 | 166-172 |
| 3 | 173-179 |
| 4 | 180-186 |
| 5 | 187-193 |

Since the zeroth interval feature is assigned a minimum value of 152, the first byte of the zeroth interval feature, following the zeroth slope feature, is equal to 152+2=154, and the value of the first byte is incremented by one to obtain the value of the second byte of the zeroth interval feature which is equal to 155, in the same manner to that described above with respect to the zeroth slope transition feature. So far, the signature is defined by the bytes 66 67 154 155.

The next 4-delta value which is equal to or greater than the threshold value of 16 and which corresponds to the end of the interval, occurs at sampling point 30 and is equal to +19 (upslope). It will be appreciated that the sampling point used for the next slope transition at point 30 is different from the sampling point used for the end of the interval at point 31, for practical considerations in determining and capturing the pattern, but that such data satisfactorily approximates the desired operation of FIG. 3. The minimum assigned value for the first byte of the next or first slope feature is thus equal to 75. Thus, since a 4-delta value of +19 has a 4-delta translation value of 1, the first and second bytes of this next set are equal to 76 77.

The next or first interval feature occurs from the flat defined by sampling point 31 having a 4-delta value of +15 to a downslope at point 33 having a 4-delta value of −28. The sampling point 32 has an absolute value less than the threshold value of 16, and thereby indicates a flat, which does not represent a transition from the previous sampling point 31 which also represents a flat. Thus, the first interval feature has a value of 33−31=2 and an interval translation value of 2. Given the minimum value of 159 from Table VI and the interval translation value of 2, the first interval feature is represented by bytes 161 162.

The second slope feature is represented by the bytes 91 92. Basically, the next sampling point having an absolute 4-delta value greater than +19 occurs at sampling point 33 having a 4-delta value of −28 and a slope translation value of 1. Since the minimum value of the bytes assigned to the second slope feature, for a downslope, is equal to 90, the two bytes become equal to 91 92. Since sampling points 34, 35 and 36 all have absolute values greater than the threshold value of 16, they all represent downslopes so that there is no slope transition defined thereby. Thus, the next slope transition occurs at sampling point 37 having a 4-delta value of +1 and thereby represents a flat. There is thus a slope transition from a downslope to a flat. The second interval feature therefore has a value of 37−33=4, having a translation value of 3. For the second interval feature, the minimum value is 166, so that the two bytes representing the second interval are 169 170.

The third slope transition feature is determined from sampling point 36. It will be recognized that sampling points 34 and 35 also have 4-delta absolute values greater than the threshold value of 16. However, since, by definition, the number of slope transitions is greater by only one to the number of intervals, only one value in the preceding interval is taken, this being the last value corresponding to sampling point 36, which is associated with the end of the interval. Thus, sampling point 36 has a 4-delta value of −21 and a 4-delta translation value of 1. Given the minimum value of the byte set of 100 for a downslope, the two bytes of the third slope feature are 101 102.

The next or third interval feature since the last event is set by sampling point 38, which represents a slope change from a flat to an upslope. Thus, the interval since the last event is equal to 38−37=1, having an interval translation value of 1. Given the minimum byte value for the first byte of the third interval feature as 173, the next two bytes added to the signature are therefore 174 175.

The next sampling point having a 4-delta value equal to or greater than the threshold value of 16 is sampling point 38 having a 4-delta value of +16 and a 4-delta translation value of 1. Thus, for the fourth slope transition feature having a minimum value of 105, the two bytes 106 107 are added to the signature. For the fourth interval feature, having a minimum byte value of 180, the transition is from the last event at sampling point 38, representing an upslope, and sampling point 40, representing a flat. Thus, the interval feature has a value of 40−38=2, and an interval translation value of 2. Therefore, the bytes 182 183 are added to the signature.

The last 4-delta value which is greater than the threshold value of 16 occurs at sampling point 39, having a 4-delta value of +16 and a 4-delta translation value of 1. Therefore, for the fifth and final slope transition feature, the bytes 116 117 are added to the signature. There are no further slope transitions in the next 12 sampling points, occurring over 0.1 second, whereby accumulation of the signature terminates, and the system returns to the AWAITING TRIGGER state.

The final signature that is detected and captured is as follows:

| SLOPE | INTERVAL | SLOPE | INTERVAL |
|---|---|---|---|
| 66 67 | 154 155 | 76 77 | 161 162 |
| SLOPE | INTERVAL | SLOPE | INTERVAL |
| 101 102 | 174 175 | 106 107 | 182 183 |
| SLOPE | | | |
| 116 117 | | | |

Although not present in the above example, a transition between a positive 4-delta value (upslope) and a negative 4-delta value (downslope) which are greater than the threshold value, known as a "peak" or "valley", is handled as follows, as previously explained. The transition is treated as two transitions, each between a 4-delta value equal to or greater than the threshold value and a 4-delta value less than the threshold value, with the interval feature between the two transitions being set equal to zero.

The signature is translated from the numerical values above to other indicators. For example, the upslope and downslope features are translated as follows:

TABLE VII

| Upslope_Set | Translation | Downslope_Set | Translation |
|---|---|---|---|
| 65–69 | ABCDE | 70–74 | FGHIJ |
| 75–79 | KLMNO | 80–84 | PQRST |
| 85–89 | UVWXY | 90–94 | Z[\]^ |
| 95–99 | _'abc | 100–104 | defgh |
| 105–109 | ijklm | 100–114 | nopqr |
| 115–119 | stuvw | 120–124 | xyz{| |
| 125–129 | }~... | 130–134 | ... |
| 135–139 | ... | 140–144 | ... |

In like manner, there is a translation of the interval features (not shown).

Thus, for example, the patterns of FIG. 4 are detected and captured, as discussed above, and the signatures are translated to the other indicators, as shown in FIG. 5, including translation for the above example in bin 8. This is performed in the next step 58 in FIG. 2.

After the signature is created, in step 60 of FIG. 2, it is compared to the set of existing signatures of previously created pattern classes. Basically, signatures are compared in the aforementioned PF 474 chip, as described in U.S. Pat. No. 4,490,811, the entire disclosure of which is incorporated herein by reference, generally by using a theta string comparison algorithm. The proximity of the new signature to the best match is determined. Specifically, it is determined in step 62 of FIG. 2 is the proximity to the best match is greater than a predetermined threshold value, for example, 0.7 in the preferred embodiment. If yes, then in step 64, the new pattern is recorded in a log file in RAM 14 or a buffer 16 as a member of the class corresponding to the best match signature. In FIG. 5, the proximity values are given in the range of 0 to 255, and can be placed in decimal form by dividing by 255. For example, pattern 8 would have a proximity value of 1.0. On the other hand, if the proximity of the best match is less than the threshold value, then in step 66, a new class is created bearing the new signature, and the pattern is recorded in the log file as a member (the first) of the new class, as was done with pattern number 4 of FIG. 4. It is to be noted that, in the case where no signatures have been pre-loaded into the buffers 16 or RAM 14, and the new signature is the first signature constructed, the best match proximity is programmed to zero, thus forcing the first signature to create a new class.

Generally, the PF 474 chip 30 includes a proximity section to determine the closeness or proximity of two signatures, and a ranking section which compares the new pattern to previously stored patterns. The PF-PC board used with chip 30 also includes a DMA, since thousands of strings per second are compared and ranked in the respective sections.

After a pattern has been classified by PF 474 chip 30 in an existing class, a signal averaging operation occurs, in step 68. Basically, as each pattern is classified, it is averaged with all previous instances of the pattern in the same class, up to a maximum number of instances, for example, 32 instances. Basically, once the first 32 pattern occurrences in a class are averaged, the signature or pattern for the class is determined, and it is no longer necessary to perform the averaging operation. The purpose of the averaging operation is to provide clean images for reconstruction of the sequence of patterns later on.

Generally, a registration point is located for the new pattern by locating the time of greatest absolute deviation of the new pattern from its value at the onset or trigger point of the pattern, based on the raw data of Table I. After the registration point has been located, the raw signal data within an interval 0.25 seconds in advance of the registration point and 0.5 seconds after the registration point, is averaged, by means of a weighted average, with the already determined average for the 31 or less previous occurrences of the class. The data used in the averaging operation is the raw data of Table I, whereby reconstruction can readily be performed. The averaged waveforms for each class are shown, for example, in FIG. 6, in which the upper left number for each waveform is the bin number and the lower left number for each waveform is the number of occurrences of the pattern in the bin. Although the numbers at the lower left of each waveform are sometimes greater than 32, only the first 32 of such waveforms are averaged, to obtain the average waveform for the respective classification. The signatures for the averaged waveforms of FIG. 6 are also created in accordance with the above analysis, and are shown in FIG. 7.

Then, in step 70, the log file is update with the pattern information. The pattern information for every pattern that has been detected and captured is stored in memory. For example, for a 24 hour time period, there may be 100,000 patterns that are stored in memory. In order to conserve memory, various storage rules are followed. First, the raw data for each pattern is not stored. Rather, each pattern is correlated with its average representation in the respective classification. In this manner, only a limited amount of actual raw and signature data need be stored. Next, only transitions between bins are indicated. For example, the information stored in memory is that 10 successive waveforms are classified in bin 2, followed by 3 successive waveforms classified in bin 1, followed by 20 successive waveforms classified in bin 4. In this manner, memory space is reduced, although a particular pattern, for example, a pattern occurring at 10:53:37 a.m. can readily be obtained.

After the log file has been updated in step 70, the operation returns to step 50 to start again with respect to the next EKG waveform or pattern.

It will be appreciated that, although an example has been given with respect to EKG signals, the present invention has general application, and can be applied to recurring signals in a plurality of fields, such as gas turbines, oil well dipmeter logs, signature analysis and the like.

Having described a preferred embodiment of the present invention with reference to the accompanying drawings, it is to be appreciated that the present invention is not limited to that precise embodiment and that various changes and modifications can be made to the invention by one of ordinary skill in the art without departing from the scope and spirit of the invention as defined by the appended claims.

What is claimed is:

1. A method of performing pattern analysis of a digital signal containing at least one waveform, comprising the steps of:

detecting a fiducial point of each waveform of said digital signal, said step of detecting said fiducial point of each waveform including the step of detecting a segment of the respective waveform, which segment has a slope with an absolute value greater than a trigger value, said step of detecting a segment including the steps of forming a delta value for each sampling point of said digital signal by subtracting the value of each sampling point from the value of the sampling point occurring m sampling points previous thereto, determining the average of n highest differences in values between consecutive sampling points in a predetermined interval of said digital signal, obtaining said trigger value based on said average, and detecting a first sampling point having a delta value at least equal to said trigger value as said fiducial point, where m an n are integers;

capturing at least two characteristic features of each waveform of said digital signal;

creating a signature for each waveform based on said captured at least two characteristic features of each waveform;

determining a closest proximity of said signature to one classification of at least one previously determined classification of signatures;

creating a new classification with said signature if said closest proximity has a value less than a predetermined threshold value; and adding said signature to said one classification if said closest proximity has a value at least equal to said predetermined threshold value.

2. A method according to claim 1; wherein m is equal to four.

3. A method according to claim 1; wherein n is equal to seven.

4. A method of performing pattern analysis of a digital signal containing at least one waveform, comprising the steps of:

detecting a fiducial point of each waveform of said digital signal, said step of detecting said fiducial point of each waveform including the step of detecting a segment of the respective waveform, which segment has a slope with an absolute value greater than a trigger value, capturing at least two characteristic features of each waveform of said digital signal, said step of capturing includes the step of capturing a plurality of interval features and a plurality of slope transition features separated by said plurality of interval features, said step of capturing a plurality of interval features and a plurality of slope transition features separated by said plurality of interval features includes the step of detecting each of a plurality of slope transitions between a positive slope, a negative slope and a flat, each slope transition separated by a plurality of intervals, and said step of detecting each of a plurality of slope transitions separated by a plurality of intervals includes the steps of forming a delta value for each sampling point by subtracting a value of each sampling point from a value of the sampling point occurring m sampling points previous thereto, determining the average of n highest differences in values between consecutive sampling points in a predetermined interval of said digital signal, obtaining a trigger value based on said average, and determining said plurality of slope transitions and the plurality of intervals in accordance with a relation between the delta values for said sampling points and said trigger value where m and n are integers;

creating a signature for each waveform based on said captured at least two characteristic features of each waveform;

determining a closest proximity of said signature to one classification of at least one previously determined classification of signatures;

creating a new classification with said signature if said closest proximity has a value less than a predetermined threshold value; and adding said signature to said one classification if said closest proximity has a value at least equal to said predetermined threshold value.

5. A method according to claim 4; wherein said step of detecting said plurality of slope transitions and intervals in accordance with a relation between the delta values for the sampling points and said trigger value, includes the steps of classifying a slope as an upslope if a sampling point has a positive delta value equal to said trigger value, as a flat if said sampling point has an absolute delta value less than said trigger value, and as a downslope if said sampling point has a negative delta value and an absolute delta value at least equal to said trigger value, and determining changes between an upslope, flat and downslope in accordance with the delta values of said sampling points.

6. A method according to claim 4; wherein m is equal to four.

7. A method according to claim 4; wherein n is equal to seven.

8. A method of performing pattern analysis of a digital signal containing at least one waveform, comprising the steps of:

detecting a fiducial point of each waveform of said digital signal, said step of detecting said fiducial point of each waveform including the step of detecting a segment of respective waveform, which segment has a slope with an absolute value greater than a trigger value, capturing at least two characteristic features of each waveform of said digital signal, said step of capturing includes the step of capturing a plurality of slope transition features and a plurality of interval features that separate said slope transition features;

creating a signature for each waveform based on said captured at least two characteristic features of each waveform; said step of creating said signature includes the step of assigning different values to each of said captured slope transition features and interval features;

determining a closest proximity of said signature to one classification of at least one previously determined classification of signatures;

creating a new classification with said signature if said closest proximity has a value less than a predetermined threshold value; and adding said signature to said one classification if said closest proximity has a value at least equal to said predetermined threshold value.

9. A method according to claim 8; wherein said step of assigning different values includes the step of assigning a first value to each interval feature and a second value which differs from said first value by one.

10. A method according to claim 9, wherein said step of assigning a first value and second value includes the step of forming a delta value for each sampling point by subtracting a value of each sampling point from a value of the sampling point occurring m sampling points previous thereto, translating the delta value for a sampling point corresponding to an interval feature to a delta translation value, assigning an initial value to each interval feature, and adding said delta translation value to said initial value for each interval feature to obtain said first value, where m and n are integers.

11. A method according to claim 10; wherein m is equal to four.

12. A method according to claim 9; wherein said step of assigning a first value and second value includes the step of adding one to said first value to obtain said second value.

13. A method according to claim 8; wherein said step of assigning different values includes the step of translating said different values into characters.

14. A method according to claim 13; wherein the step of determining the closest proximity includes the step of comparing said characters to characters which define signatures in said classifications.

15. Apparatus for performing pattern analysis of a digital signal containing at least one waveform, comprising:

means for detecting a fiducial point of each waveform of said digital signal, for capturing at least two characteristic features of each of said waveforms of said digital signal, and for creating a signature for each waveform based on said captured at least two characteristic features of each of said waveforms, and said means for detecting forms a delta value for each sampling point of said digital signal by subtracting the value of each sampling point from the value of the sampling point occurring m sampling points previous thereto, determining the average of n highest differences in values between consecuive sampling points in a predetermined interval of said digital signal, obtaining a trigger value based on said average, and detecting a first sampling point as being a fiducial point when a delta value is equal to or greater than said trigger value, where m and n are integers;

means for determining a closest proximity of said signature to one classification of at least one previously determined classification of signatures; and means for storing said signature as a new classification if said closest proximity has a value less than a predetermined threshold value, and for storing said signature as part of an existing classification if said closest proximity has a value equal to or greater than said predetermined threshold value.

16. Apparatus according to claim 15; wherein m is equal to four.

17. Apparatus according to claim 15; wherein n is equal to seven.

18. Apparatus for performing pattern analysis of a digital signal containing at least one waveform, comprising:

means for detecting a fiducial point of each waveform of said digital signal, for capturing at least two characteristic features of each of said waveforms of said digital signal, and for creating a signature for each waveform based on said captured at least two characteristic features of each of said waveforms, and said means for detecting forms a delta value for each sampling point by subtracting the value of each sampling point from the value of the sampling point occurring m sampling points previous thereto, determining the average of n highest differences in values between consecutive sampling points in a predetermined interval of said digital signal, obtaining a trigger value based on said average, and determining a plurality of slope transitions and intervals in accordance with a relation between said delta values for the sampling points and said trigger value, where m and n are integers;

means for determining a closest proximity of said signature to one classification of at least one previously determined classification of signatures; and means for storing said signature as a new classification if said closest proximity has a value less than a predetermined threshold value, and for storing said signature as part of an existing classification if said closest proximity has a value equal to or greater than said predetermined threshold value.

19. Apparatus according to claim 18; wherein m is equal to four.

20. Apparatus according to claim 18; wherein n is equal to seven.

21. Apparatus according to claim 18; wherein said means for detecting classifies a slope as an upslope if a sampling point has a positive delta value equal to or greater than said trigger value, as a flat if said sampling point has an absolute delta value less than said trigger value, and as a downslope if said sampling point has a negative delta value and an absolute delta value equal to or greater than said trigger value, and determines changes between an upslope, flat and downslope in accordance with the delta values of said sampling points.

22. Apparatus for performing pattern analysis of a digital signal containing at least one waveform, comprising:

means for detecting a fiducial point of each waveform of said digital signal, for capturing at least two characteristic features of each of said waveforms of said digital signal including a plurality of interval features and a plurality of slope transition features separated by said interval features, for creating a signature for each waveform based on said captured at least two characteristic features of each of said waveforms, and for assigning a first value to each feature and a second value which differs from said first value by one to each said feature to provide a blurring effect to that minor deviation in patterns can be accounted for;

means for determining a closest proximity of said signature to one classification of at least one previously determined classification of signatures; and means for storing said signature as a new classification if said closest proximity has a value less than a predetermined threshold value, and for storing said signature as part of an existing classification if said closest proximity has a value equal to or greater than said predetermined threshold value.

23. Apparatus according to claim 22; wherein said means for detecting forms a delta value for each sampling point by subtracting the value of each sampling point from the value of the sampling point occurring m sampling points previous thereto, translates the delta value for a sampling point corresponding to a feature to a delta translation value, assigns an initial value to each feature, and adds said delta translation value to said initial value for each feature to obtain said first value.

24. Apparatus according to claim 23; wherein m is equal to four.

* * * * *